United States Patent
Tsai et al.

[11] Patent Number: 6,001,746
[45] Date of Patent: Dec. 14, 1999

[54] METHOD OF FORMING AN UNDOPED SILICATE GLASS LAYER ON A SEMICONDUCTOR WAFER

[75] Inventors: Cheng-Yuan Tsai, Yun-Lin Hsien; Chih-Chien Liu, Taipei; Wen-Yi Hsieh, Hsien-Chu; Water Lur, Taipei, all of Taiwan

[73] Assignee: United Microelectronics Corp., Hsin-chu, Taiwan

[21] Appl. No.: 09/314,928

[22] Filed: May 20, 1999

[51] Int. Cl.[6] .................................................. H01L 21/316
[52] U.S. Cl. ........................ 438/788; 438/778; 438/771; 438/758; 204/622
[58] Field of Search .................... 438/758, 771, 438/778, 788

[56] References Cited

U.S. PATENT DOCUMENTS 5,937,323  8/1999  Orczyk et al. ........................... 438/624

*Primary Examiner*—Charles Bowers
*Assistant Examiner*—L. Kilday
*Attorney, Agent, or Firm*—Winston Hsu

[57] ABSTRACT

The present invention provides a method of forming an undoped silicate glass layer on a semiconductor wafer by performing a high density plasma chemical vapor deposition process. The semiconductor wafer being positioned in a deposition chamber. The method comprises forming the undoped silicate glass layer by performing the high density plasma chemical vapor deposition process in the deposition chamber under the following conditions: an argon (Ar) flow rate of 40 to 70 sccm (standard cubic centimeter per minute); an oxygen ($O_2$) flow rate of 90 to 120 sccm; a silane flow rate of 70 to 100 sccm; a gas pressure of 3 to 10 mtorr; a temperature of 300 to 400° C.; and a low frequency power of 2500 to 3500 watts. Wherein the ratio of Ar to $O_2$ is 0.53, and $O_2$ to silane is 1.23.

3 Claims, 2 Drawing Sheets

METHOD OF FORMING AN UNDOPED SILICATE GLASS LAYER ON A SEMICONDUCTOR WAFER

BACKGROUND OF THE INVENTION

1. Field of the invention

The present invention relates to a method of forming an undoped silicate glass (USG) layer on a semiconductor wafer, and more particularly, to a method of forming an undoped silicate glass layer on a semiconductor wafer using high-density plasma chemical vapor deposition (HDPCVD).

2. Description of the Prior Art

Prior to metallization, dielectric material must be deposited onto the surface of a semiconductor wafer to isolate the MOS transistors and the metal interconnects subsequently produced. Generally speaking, the deposited dielectric material comprises a thinner undoped silicate glass (USG) layer for protecting and isolating the elements on the semiconductor wafer and a thicker planarization dielectric layer deposited over the USG layer as the main dielectric layer for subsequent metallization. The HDPCVD process is very effective in filling holes and is used to deposit the USG layer. The HDPCVD chamber is connected to the gas transporting system, the plasma generator, and the process control system. The reaction gases and plasma are transported to the deposition chamber then reach the surface of the semiconductor wafer to form solid material on the surface by chemical deposition.

Please refer to FIG. 1 and FIG. 2. FIG. 1 is a schematic diagram of the deposit chamber 10 of HDPCVD according to the prior art. FIG. 2 is a top view of the injector 16 and the semiconductor wafer 14 shown in FIG. 1. The HDPCVD deposition chamber 10 comprises a pedestal 12 for supporting a semiconductor wafer 14 and a plurality of injectors 16 evenly placed on the chamber wall around the periphery of the pedestal 12. Reaction gases are injected in by the injectors 16, then used in processing on the surface of the semiconductor wafer 14.

When USG deposition is performed in the deposition chamber 10, the semiconductor wafer 14 is placed on the pedestal 12 first, then each injector 16 injects a mixed gas of argon, oxygen, and silane. This mixed gas will be ionized by the plasma and then diffuse onto the surface of the semiconductor wafer 14 to form a USG layer. By the nature of HDPCVD, sputtering and etching are simultaneously taken place and it leads to the ion bombardment on the wafer. This is the basic concept behind in-situ deposition and sputtering in HDPCVD process.

Generally, when performing USG deposition in the deposition chamber 10, injectors 16 measuring 4 inches in length are utilized. The opening of each injector 16 is above the area 18 of the surface of the semiconductor wafer 14 as shown in FIG. 2. Because the opening of each injector 16 is above the area 18, most of the mixed gases collect in the area 18 of the surface of the semiconductor wafer 14 during the HDPCVD process. Therefore, the USG layer deposited on the semiconductor wafer 14 will not be uniform with the USG layer within the area 18 being thicker than the USG layer outside the area 18. The USG layer in the center of the semiconductor wafer 14 will be thinnest of all. Usually this non-uniformity of thickness is the biggest drawback of the HDPCVD process causing problems in subsequent processing and greatly affecting the function of the dielectric layer.

SUMMARY OF THE INVENTION

It is therefore a primary objective of the present invention to provide a method of forming a USG layer on a semiconductor wafer by HDPCVD that is uniform in thickness to solve the above mentioned problem.

In a preferred embodiment, the present invention provides a method of forming an undoped silicate glass layer on a semiconductor wafer by performing a high density plasma chemical vapor deposition process, the semiconductor wafer being positioned in a deposition chamber, the method comprising:

forming the undoped silicate glass layer by performing the high density plasma chemical vapor deposition process in the deposition chamber under the following conditions:
 an argon (Ar) flow rate of 40 to 70 sccm (standard cubic centimeter per minute);
 an oxygen ($O_2$) flow rate of 90 to 120 sccm;
 a silane flow rate of 70 to 100 sccm;
 a gas pressure of 3 to 10 mtorr;
 a temperature of 300 to 400° C.; and
 a low frequency power of 2500 to 3500 watts;
wherein the ratio of Ar to $O_2$ is 0.53, and $O_2$ to silane is 1.23.

It is an advantage of the present invention that the injectors are shorter and the mixed gas reaching the surface of the semiconductor wafer will be more uniform. Also, because a lower flow rate of mixed gas of argon, oxygen, and silane is used as the reaction gas, the USG layer thus formed will be more uniform in thickness. A USG layer with uniform thickness not only protects and isolates the elements on the semiconductor wafer 24 more effectively, but also facilitates subsequent processing.

This and other objectives of the present invention will no doubt become obvious to those of ordinary skill in the art after having read the following detailed description of the preferred embodiment which is illustrated in the various figures and drawings.

DETAILED DESCRIPTION OF THE PREFERRED EMBODIMENT

Figure 1:
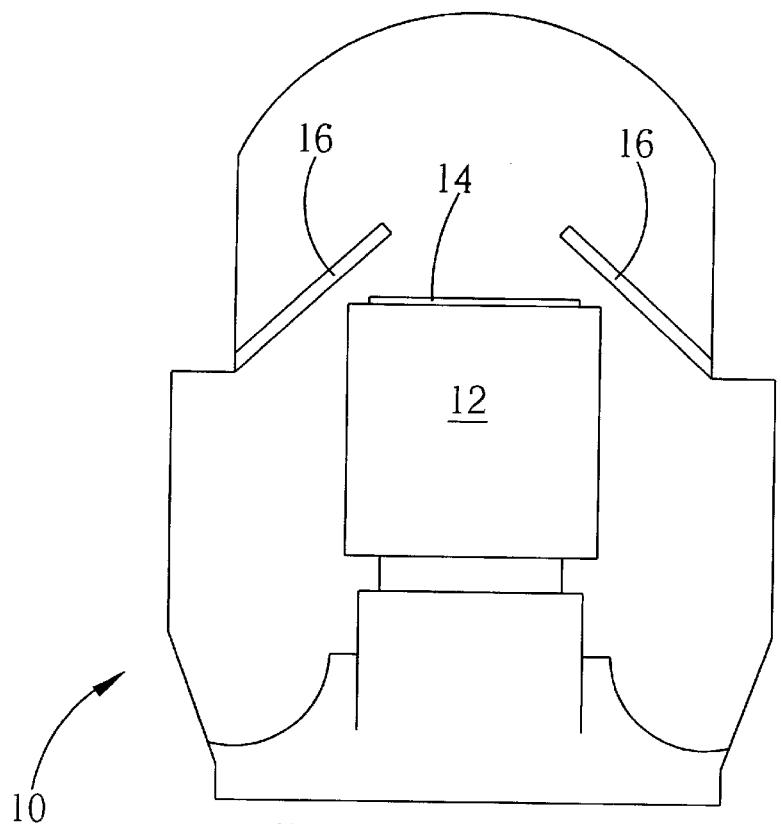
FIG. 1 is a schematic diagram of the deposit chamber of HDP CVD according to the prior art.
Figure 2:
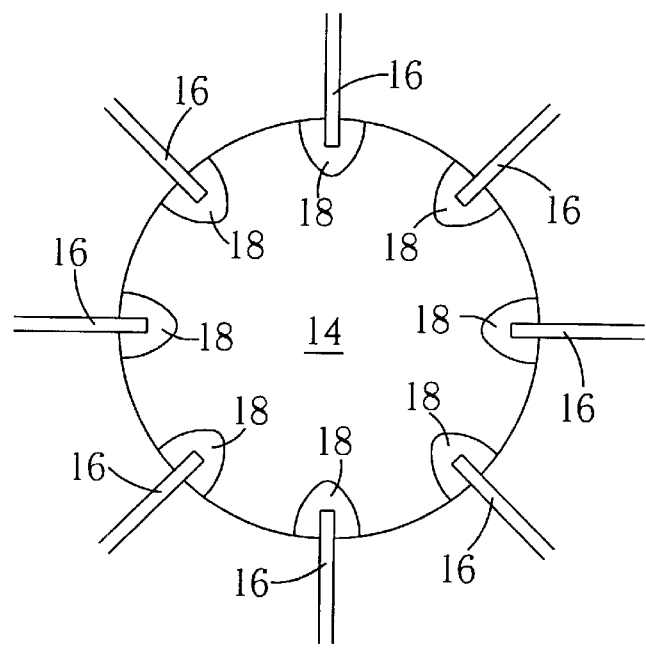
FIG. 2 is a top view of the injector and the semiconductor wafer shown in FIG. 1.
Figure 3:
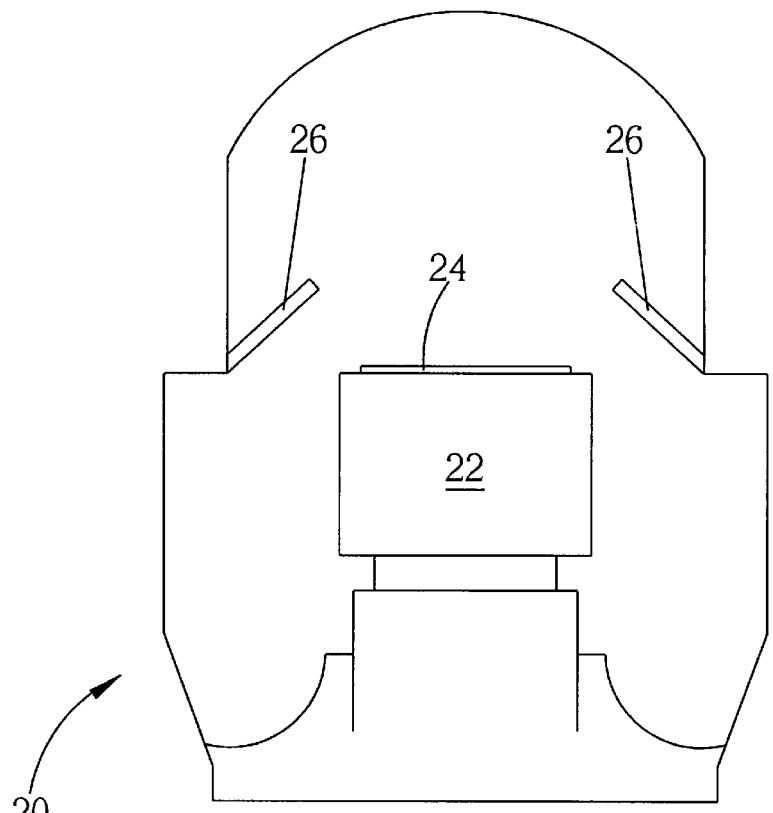
FIG. 3 is a schematic diagram of the deposit chamber of HDP CVD according to the present invention.
Figure 4:
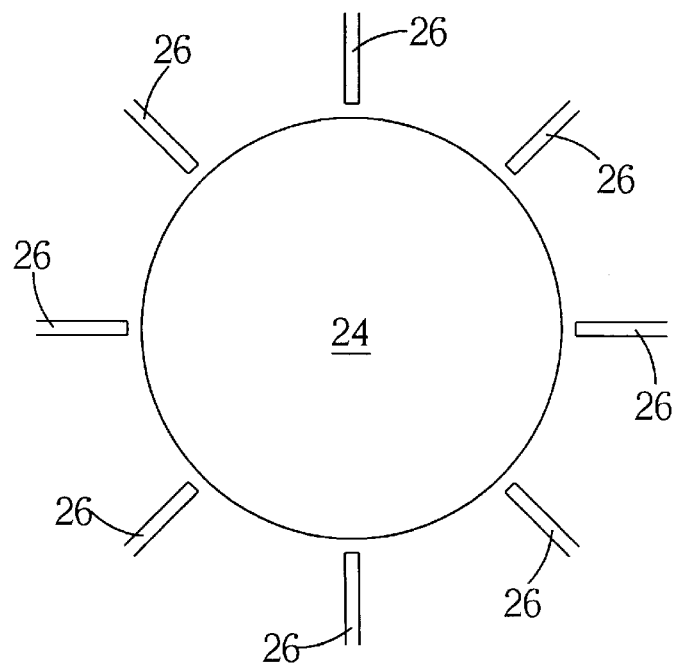
FIG. 4 is a top view of the injector and the semiconductor wafer shown in FIG. 3.

Please refer to FIG. 3 and FIG. 4. FIG. 3 is a schematic diagram of the HDPCVD deposit chamber 20 according to the present invention. FIG. 4 is a top view of the injector 26 and the semiconductor wafer 24 shown in FIG. 3. In the method of the present invention of forming an undoped silicate glass layer on a semiconductor wafer by performing a high density plasma chemical vapor deposition process (HDPCVD), the semiconductor wafer 24 is first positioned in a deposition chamber 20. The deposition chamber 20 comprises a pedestal 22 and a plurality of injectors 26 installed on the chamber wall around the periphery of the pedestal 12. The pedestal 22 supports the semiconductor wafer 24 in a horizontal position as the injectors 26 inject a mixed gas of argon, oxygen, and silane onto the surface of the semiconductor wafer 24. Furthermore, the injectors 26 are uniformly distributed around the periphery of the pedestal 22 with their openings positioned at the same height 1.86 inches above the pedestal. The length of each injector 26 is 2.5 inches.

Formation of the undoped silicate glass layer by high density plasma chemical vapor deposition in the deposition chamber is carried out under the following conditions: an argon (Ar) flow rate of 40 to 70 sccm (standard cubic centimeter per minute), an oxygen ($O_2$) flow rate of 90 to 120 sccm, a silane flow rate of 70 to 100 sccm, a gas pressure of 3 to 10 mtorr, a temperature of 300 to 400° C., and a low frequency power of 2500 to 3500 watts, wherein the ratio of Ar to $O_2$ is 0.53 and $O_2$ to silane is 1.23. When depositing the USG layer by HDPCVD in the deposition chamber 20, the semiconductor wafer 24 is positioned on the pedestal 22 horizontally and each injector 26 injects the mixed gas of argon, oxygen, and silane. The mixed gas reaches the surface of the semiconductor wafer 24 by diffusion after which time a USG layer is formed on the surface of the semiconductor wafer 24 through the CVD reaction.

The injectors 26 are short and the opening of each injector 26 is positioned around the periphery of the surface of the semiconductor wafer 24. In this way, the mixed gas is spread more evenly on the surface of the semiconductor wafer 24. Also, a lower flow rate of the mixed gas of argon, oxygen, and silane is used. This low flow rate allows the mixed gas to be more uniformly spread over the surface of the semiconductor wafer 24 and form a USG layer with uniform thickness. When the thickness of the USG layer becomes more uniform, the elements on the semiconductor wafer 24 are better protected and isolated. The deposition chamber 20 of the present invention can also be used to deposit a fluorosilicate glass (FSG) layer with no additional hardware or change in the present hardware. Both time and money can be saved since either a USG layer or a FSG layer may be deposited with the same apparatus.

Compared to the prior art method of forming a USG layer by HDPCVD, the present invention utilizes injectors 26 of shorter length in the deposition chamber 20 with openings all positioned around the periphery of the surface of the semiconductor wafer 24 and also utilizes a lower flow rate of reaction gases so as to form a USG layer of more uniform thickness.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A method of forming an undoped silicate glass layer on a semiconductor wafer by performing a high density plasma chemical vapor deposition process, the semiconductor wafer being positioned in a deposition chamber, the method comprising:

forming the undoped silicate glass layer by performing the high density plasma chemical vapor deposition process in the deposition chamber under the following conditions:
an argon (Ar) flow rate of 40 to 70 sccm (standard cubic centimeter per minute);
an oxygen ($O_2$) flow rate of 90 to 120 sccm;
a silane flow rate of 70 to 100 sccm;
a gas pressure of 3 to 10 mtorr;
a temperature of 300 to 400° C.; and
a low frequency power of 2500 to 3500 watts;
wherein the ratio of Ar to $O_2$ is 0.53, and $O_2$ to silane is 1.23.

2. The method of claim 1 wherein the deposition chamber comprises a plurality of injectors for injecting a mixed gas of argon, oxygen, and silane and a pedestal for supporting the semiconductor wafer horizontally.

3. A The method of claim 2 wherein the injectors are uniformly distributed around a periphery of the pedestal and openings of the injectors are of the same height, and the openings are 1.86 inches above the pedestal.

* * * * *